(12) United States Patent
Wu

(10) Patent No.: US 11,373,431 B2
(45) Date of Patent: Jun. 28, 2022

(54) ELECTRONIC DEVICE

(71) Applicant: VISUAL SENSING TECHNOLOGY CO., LTD., Hsinchu (TW)

(72) Inventor: Chih-Yen Wu, Hsinchu (TW)

(73) Assignee: VISUAL SENSING TECHNOLOGY CO., LTD., Hsinchu (TW)

( * ) Notice: Subject to any disclaimer, the term of this patent is extended or adjusted under 35 U.S.C. 154(b) by 173 days.

(21) Appl. No.: 16/923,109

(22) Filed: Jul. 8, 2020

(65) Prior Publication Data

US 2021/0224504 A1 Jul. 22, 2021

Related U.S. Application Data

(60) Provisional application No. 62/963,188, filed on Jan. 20, 2020.

(30) Foreign Application Priority Data

May 7, 2020 (TW) .................................. 109115164

(51) Int. Cl.
*H01L 27/146* (2006.01)
*G06V 40/13* (2022.01)

(52) U.S. Cl.
CPC .... *G06V 40/1318* (2022.01); *H01L 27/14623* (2013.01); *H01L 27/14627* (2013.01); *H01L 27/14678* (2013.01)

(58) Field of Classification Search
CPC ......... H01L 27/14623; H01L 27/14627; H01L 27/14678; G06V 40/1318
See application file for complete search history.

(56) References Cited

U.S. PATENT DOCUMENTS

2018/0301494 A1* 10/2018 Park .................... H01L 27/3234
2019/0095672 A1* 3/2019 Yeke Yazdandoost ......................
H01L 27/1462

FOREIGN PATENT DOCUMENTS

| CN | 110164897 | 8/2019 |
| CN | 110493504 | 11/2019 |
| TW | I651582 | 2/2019 |

OTHER PUBLICATIONS

"Office Action of Taiwan Counterpart Application", dated Feb. 5, 2021, p. 1-p. 4.

\* cited by examiner

*Primary Examiner* — Tucker J Wright
(74) *Attorney, Agent, or Firm* — JCIPRNET

(57) ABSTRACT

An electronic device including a plurality of micro-lenses, a light-limiting structure, a first light-transmitting structure, and a sensing element is provided. The plurality of micro-lenses are arranged in an array. The sensing element includes a plurality of sensing pixels. The sensing element, the first light-transmitting structure, the light-limiting structure, and the plurality of micro-lenses are sequentially stacked in a stacking direction. Each of the plurality of sensing pixels corresponds to at least two of the plurality of micro-lenses in the stacking direction.

8 Claims, 2 Drawing Sheets

ELECTRONIC DEVICE

CROSS-REFERENCE TO RELATED APPLICATION

This application claims the priority benefits of U.S. provisional application Ser. No. 62/963,188, filed on Jan. 20, 2020, and Taiwan application serial no. 109115164, filed on May 7, 2020. The entirety of each of the above-mentioned patent applications is hereby incorporated by reference herein and made a part of this specification.

BACKGROUND OF THE INVENTION

1. Field of the Invention

The invention relates to a device, in particular to an electronic device.

2. Description of Related Art

At present, an electronic device is applied to fingerprint recognition of a smart phone, and takes a capacitive fingerprint recognition system as its mainstream. Active and passive capacitive fingerprint recognition systems can be used for unlocking and function starting when attached to the smart phone. For the current situation in the market, a fingerprint recognition system is mainly mounted on a back surface of the smart phone. If the fingerprint recognition system is mounted in a front view area, perforating or a thinning program needs to be conducted on a glass display area, which causes increasing of machining costs. In addition, the fingerprint recognition system in the market further includes an ultrasonic fingerprint system and an optical fingerprint recognition system. Because optical fingerprint recognition has high light transmission, fingerprints and other features can be recognized without perforating of the glass display area. Therefore, the optical fingerprint recognition system has become a mainstream of the next generation of fingerprint recognition.

At present, there are several ways for an imaging system for optical fingerprint recognition, such as a reflecting way, a thin-film reflecting way, pinhole imaging, fiber optic imaging or a relatively large fingerprint recognition imaging system formed by matching a plurality of sets of lenses.

However, difficult design of the optical fingerprint recognition system is caused by the trends of being thin, being applied to a mobile device by being mounted below panel glass without perforating and the like in the market. For example, thickness distribution of a glass panel of a display device is in a range of 500 µm to 1 mm, and considering the thicknesses of a light-emitting element and an air layer of the display device, designers necessarily make the thickness of the fingerprint recognition system be less than 400 µm. Then considering the thickness of a sensing element being about 200 µm and the thickness of a substrate (such as a printed circuit board) of the fingerprint recognition system being about 150 µm, the whole thickness of other elements is limited in a range of 50 µm.

Furthermore, resolution of fingerprint recognition is necessarily at least 500 dots per inch (dpi), and therefore, a size of each pixel of the fingerprint recognition system is necessarily less than 50 µm. However, current molding or machining of lenses in the market still cannot reach this accurate design and alignment.

SUMMARY OF THE INVENTION

The invention provides an electronic device, which can still make micro-lenses be arranged at required positions well under the situation of reducing a whole thickness of the electronic device.

An electronic device of one embodiment of the invention includes a plurality of micro-lenses, a light-limiting structure, a first light-transmitting structure and a sensing element. The plurality of micro-lenses are arranged in an array. The sensing element includes a plurality of sensing pixels. The sensing element, the first light-transmitting structure, the light-limiting structure and the plurality of micro-lenses are sequentially stacked in a stacking direction. Each of the plurality of sensing pixels corresponds to at least two of the plurality of micro-lenses in the stacking direction.

In one embodiment of the invention, the electronic device further includes a second light-transmitting structure, arranged between the plurality of micro-lenses and the light-limiting structure. A thickness of the second light-transmitting structure in the stacking direction is in a range of 8 to 15 microns.

In one embodiment of the invention, the above second light-transmitting structure is a passivation layer.

In one embodiment of the invention, a maximum height of the plurality of above micro-lenses in the stacking direction is in a range of 1 to 3 microns.

In one embodiment of the invention, the above light-limiting structure is a metal layer.

In one embodiment of the invention, the above light-limiting structure includes a plurality of light-transmitting holes. A hole diameter of the plurality of light-transmitting holes is in a range of 1 to 3 microns. Each of the plurality of micro-lenses corresponds to one of the plurality of light-transmitting holes in the stacking direction.

In one embodiment of the invention, the above first light-transmitting structure includes a plurality of inter-metal dielectric layers.

In one embodiment of the invention, the above first light-transmitting structure further includes an inter-layer dielectric layer, arranged between the plurality of inter-metal dielectric layers and the sensing element.

In one embodiment of the invention, a thickness of the above first light-transmitting structure in the stacking direction is in a range of 8 to 15 microns.

In one embodiment of the invention, the electronic device further includes a plurality of inter-metal layers and a driving element. The plurality of inter-metal layers are embedded in the plurality of inter-metal dielectric layers respectively. The first light-transmitting structure is arranged between the light-limiting structure and the driving element. The driving element is electrically connected to the sensing element, and electrically connected to the light-limiting structure through the plurality of inter-metal layers.

Based on the above, in the electronic device of the embodiments of the invention, each of the plurality of sensing pixels corresponds to at least two of the plurality of micro-lenses in the stacking direction, and therefore, a receivable light feeding amount of each of the plurality of sensing pixels is increased. Thus, a sensing effect of the electronic device is better.

DESCRIPTION OF THE EMBODIMENTS

Figure 1:
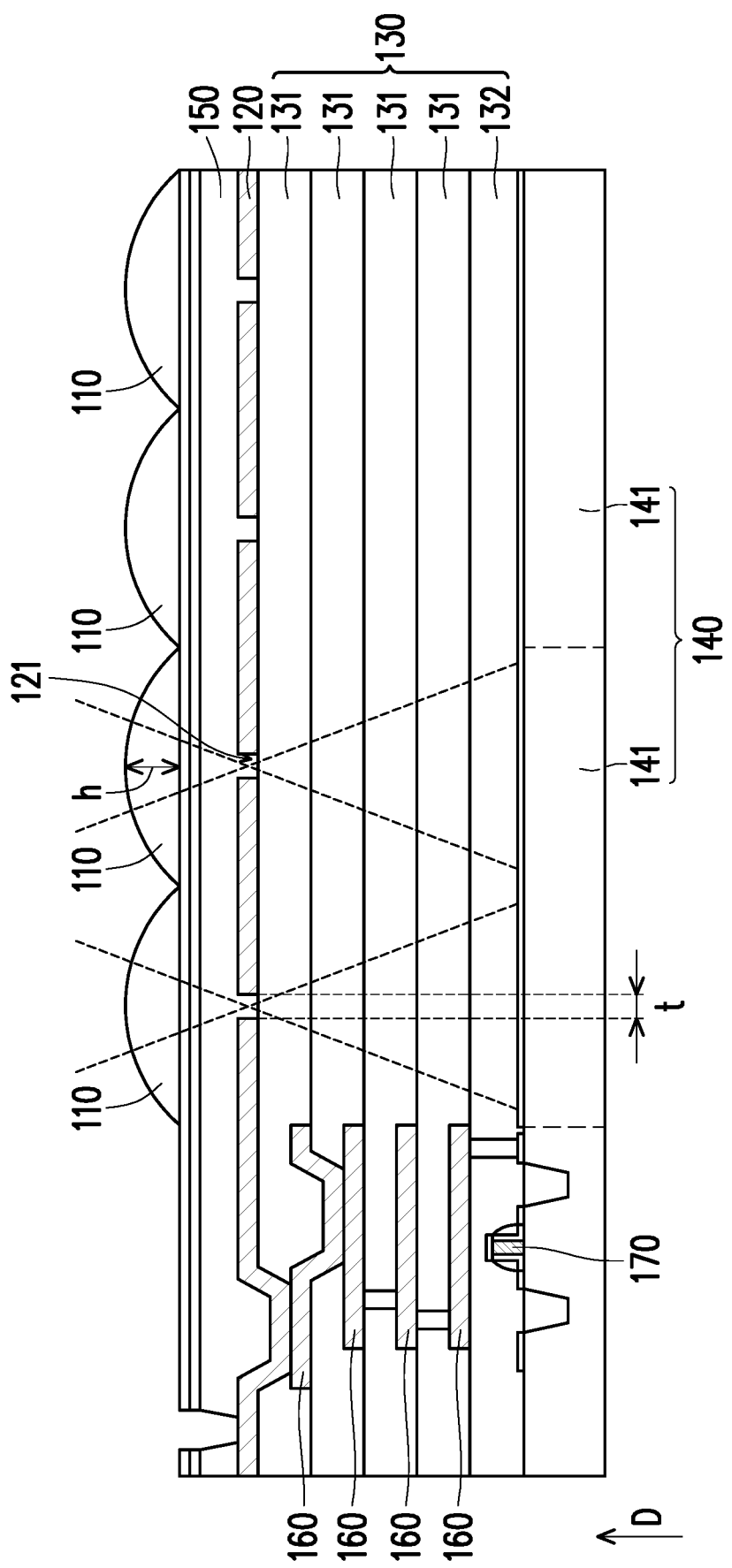
FIG. 1 is a schematic local cross-sectional diagram of an electronic device according to one embodiment of the invention.
Figure 2:
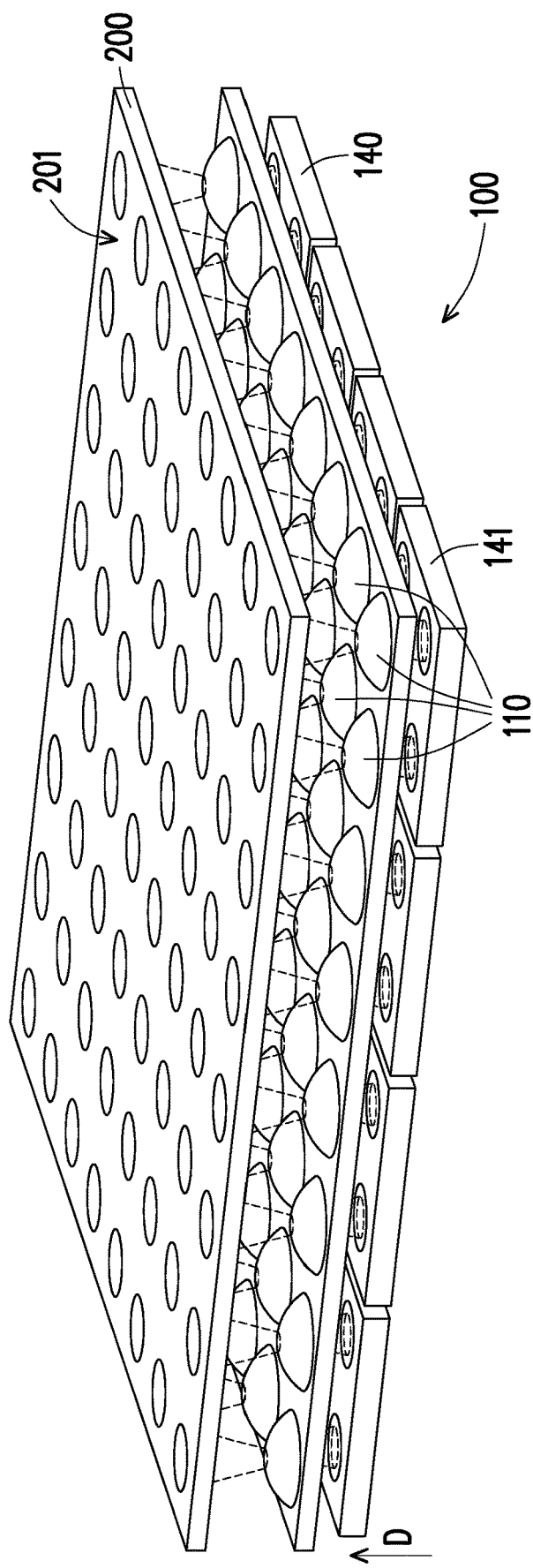
FIG. 2 is a schematic diagram of sensing pixels of an electronic device corresponding to micro-lenses according to one embodiment of the invention.

FIG. 1 is a schematic local cross-sectional diagram of an electronic device according to one embodiment of the invention. FIG. 2 is a schematic diagram of sensing pixels of an electronic device corresponding to micro-lenses according to one embodiment of the invention. It should be noted herein that a relative thickness of each stacking layer in FIG. 1 and FIG. 2 is shown merely for clear indication, and the relative thicknesses in the figures do not reflect actual relative thicknesses. Referring to FIG. 1 and FIG. 2, an electronic device 100 of one embodiment of the invention includes a plurality of micro-lenses 110, a light-limiting structure 120, a first light-transmitting structure 130 and a sensing element 140. The sensing element 140, the first light-transmitting structure 130, the light-limiting structure 120 and the plurality of micro-lenses 110 are sequentially stacked in a stacking direction D.

Specifically, the first light-transmitting structure 130, the light-limiting structure 120 and the plurality of micro-lenses 110, for example, are sequentially formed with a semiconductor process or a lithography process after the sensing element 140 is formed. In the present embodiment, the sensing element 140 includes a plurality of sensing pixels 141. The sensing element 140 may be a complementary metal-oxide semiconductor (CMOS) or a charge coupled device (CCD). The plurality of micro-lenses 110, for example, are made of high polymer materials such as polymethylmethacrylate (PMMA) or other suitable materials.

In order to make a whole thickness of the electronic device 100 in the stacking direction D be capable of being less than or equal to 50 microns after the sensing element 140 is deducted, and make the plurality of micro-lenses 110 be capable of being formed by the lithography process, in the present embodiment, a maximum height h of the plurality of micro-lenses 110 in the stacking direction D is in a range of 1 to 3 microns. Furthermore, in order to improve resolution of the electronic device 100, a size of each of the plurality of sensing pixels 141 is necessarily less than 50 microns. However, for each of the plurality of micro-lenses 110 formed by the lithography process, the size of 50 microns is too large, therefore, in the present embodiment, the plurality of micro-lenses 110 are arranged in an array, and each of the plurality of sensing pixels 141 corresponds to at least two of the plurality of micro-lenses 110 in the stacking direction D. For example, each of the plurality of sensing pixels 141 is at least partially overlapped to above at least two of the plurality of micro-lenses 110 corresponding thereto in the stacking direction D.

FIG. 2 indicates that the electronic device 100 is provided with a substrate 200. The substrate, for example, is a transparent display panel such as an organic light-emitting diode. When a finger of a user presses a surface 201 of the substrate 200, a light beam emitted by the substrate 200 is reflected by the finger, and its reflected light beam is received by the sensing element 140 of the electron device 100, so as to make the electronic device 100 obtain a fingerprint image. FIG. 2 indicates that each of the plurality of sensing pixels 141 corresponds to an array of 2×2 micro-lenses 110 in the stacking direction D. However, the invention is not limited thereto. Each of the plurality of sensing pixels 141 may correspond to an array of m×n, 1×n or m×1 micro-lenses 110 in the stacking direction D, where m and n are positive integers greater than or equal to 2.

Furthermore, in the present embodiment, the light-limiting structure 120 is a metal layer, and a thickness of the light-limiting structure 120 in the stacking direction D is less than or equal to 0.5 micron. The light-limiting structure 120 includes a plurality of light-transmitting holes 121. A hole diameter t of the plurality of light-transmitting holes 121 is in a range of 1 to 2 microns, and each of the micro-lenses 110 corresponds to one of the plurality of light-transmitting holes 121 in the stacking direction D. For example, each of the micro-lenses 110 is overlapped with the light-transmitting hole 121 corresponding thereto in the stacking direction D.

In addition, in the present embodiment, the first light-transmitting structure 130 includes a plurality of inter-metal dielectric layers (IMD layers) 131 and an inter-layer dielectric layer (ILD layer) 132. The ILD layer 132 is arranged between the IMD layers 131 and the sensing element 140. The IMD layers 131 and the ILD layer 132 may be insulating materials such as silicon dioxide or silicon nitride, but the invention is not limited to this. Furthermore, the IMD layers 131 and the ILD layer 132 may be made of same or different materials.

In the present embodiment, a thickness of the first light-transmitting structure 130 in the stacking direction D is in a range of 8 to 15 microns. In order to facilitate illustration, FIG. 1 simply indicates four inter-metal dielectric layers 131. However, the invention is not limited to thereto. The number of the inter-metal dielectric layers 131 should be determined according to design needs.

In addition, in the present embodiment, the electronic device 100 further includes a second light-transmitting structure 150. The second light-transmitting structure 150 is arranged between the micro-lenses 110 and the light-limiting structure 120. The second light-transmitting structure 150 may be a passivation layer formed by insulating materials such as silicon oxide or silicon nitride, and is configured to prevent oxidization of each element in the electronic device 100.

Based on the above, in the electronic device 100 of the embodiment of the invention, arrangement of the micro-lenses 110 and the light-limiting structure 120 enables the reflected light beam to be imaged on the sensing element 140 well. Although the arrangement of the micro-lenses 110 and the light-limiting structure 120 limits a light receiving angle of the reflected light beam, and meanwhile also reduces a light feeding amount, a receivable light feeding amount of each of the plurality of sensing pixels 141 is increased due to the fact that each of the plurality of sensing pixels 141 corresponds to at least two of the plurality of micro-lenses 110 in the stacking direction D. Thus, a sensing effect of the electronic device 100 is better. Furthermore, by increasing a thickness of the second light-transmitting structure 150, the light receiving angle of the reflected light beam may be further limited, meanwhile, an optical path of the reflected light beam from the micro-lenses 110 to the sensing element 140 is also increased, and in this case, a depth of view (DOV) of the electronic device 100 is also increased. In the present embodiment, the thickness of the second light-transmitting structure 150 in the stacking direction D is preferably in a range of 8 to 15 microns.

In addition, in the present embodiment, the electronic device further includes a plurality of inter-metal layers 160 and a driving element 170. The first light-transmitting structure 130 is arranged between the light-limiting structure 120 and the driving element 170. The plurality of inter-metal layers 160 are embedded in the plurality of IMD layers 131 respectively, and electrically connected to the light-limiting structure 120. The driving element 170 is electrically connected to the sensing element 140, and electrically connected to the light-limiting structure 120 through the plurality of inter-metal layers 160. That is, the light-limiting structure 120, the plurality of inter-metal layers 160 and the driving element 170 may be a part of a control circuit for controlling the sensing element 140. In the present embodiment, the driving element 170 may be a transistor circuit layer formed by a semiconductor process. The ILD layer 132 of the first light-transmitting structure 130 covers the sensing element 140 and the driving element 170, so as to make other stacking layers be capable of being sequentially stacked on the ILD layer 132. The inter-metal dielectric layers 131 of the first light-transmitting structure 130 are configured to avoid a phenomenon of a short circuit of the inter-metal layers 160 due to direct contact with each other.

Based on the above, in the electronic device of the embodiment of the invention, the arrangement of the micro-lenses and the light-limiting structure enables the reflected light beam to be imaged on the sensing element well. Furthermore, each of the plurality of sensing pixels corresponds to at least two of the plurality of micro-lenses in the stacking direction, and therefore, the receivable light feeding amount of each of the plurality of sensing pixels is increased. Thus, the sensing effect of the electronic device is better. Moreover, compared with lenses formed in ways such as molding or machining, the electronic device of the embodiment of the invention can form a micro-lens array in a relatively small range, and each of the plurality of micro-lenses can still be arranged at a required position well. In addition, furthermore, by increasing the thickness of the second light-transmitting structure, the light receiving angle of the reflected light beam can be further limited, meanwhile, the optical path of the reflected light beam from the micro-lenses to the sensing element is also increased, and in this case, the DOV of the electronic device is also increased.

What is claimed is:

1. An electronic device, comprising:
a plurality of micro-lenses, arranged in an array;
a light-limiting structure;
a first light-transmitting structure, comprising a plurality of inter-metal dielectric layers; and
a sensing element, comprising a plurality of sensing pixels, wherein
the sensing element, the first light-transmitting structure, the light-limiting structure, and the plurality of micro-lenses are sequentially stacked in a stacking direction, and each of the plurality of sensing pixels corresponds to at least two of the plurality of micro-lenses in the stacking direction, and wherein
the electronic device further comprises:
a plurality of inter-metal layers, respectively embedded in the plurality of inter-metal dielectric layers; and
a driving element, wherein the first light-transmitting structure is arranged between the light-limiting structure and the driving element, and the driving element is electrically connected to the sensing element, and electrically connected to the light-limiting structure through the plurality of inter-metal layers.

2. The electronic device according to claim 1, further comprising a second light-transmitting structure, arranged between the plurality of micro-lenses and the light-limiting structure, wherein a thickness of the second light-transmitting structure in the stacking direction is in a range of 8 to 15 microns.

3. The electronic device according to claim 2, wherein the second light-transmitting structure is a passivation layer.

4. The electronic device according to claim 1, wherein a maximum height of the plurality of micro-lenses in the stacking direction is in a range of 1 to 3 microns.

5. The electronic device according to claim 1, wherein the light-limiting structure is a metal layer.

6. The electronic device according to claim 1, wherein the light-limiting structure comprises a plurality of light-transmitting holes, a hole diameter of the plurality of light-transmitting holes is in a range of 1 to 2 microns, and each of the plurality of micro-lenses corresponds to one of the plurality of light-transmitting holes in the stacking direction.

7. The electronic device according to claim 1, wherein the first light-transmitting structure further comprises an inter-layer dielectric layer, arranged between the plurality of inter-metal dielectric layers and the sensing element.

8. The electronic device according to claim 1, wherein a thickness of the first light-transmitting structure in the stacking direction is in a range of 8 to 15 microns.

* * * * *